Figure 1:
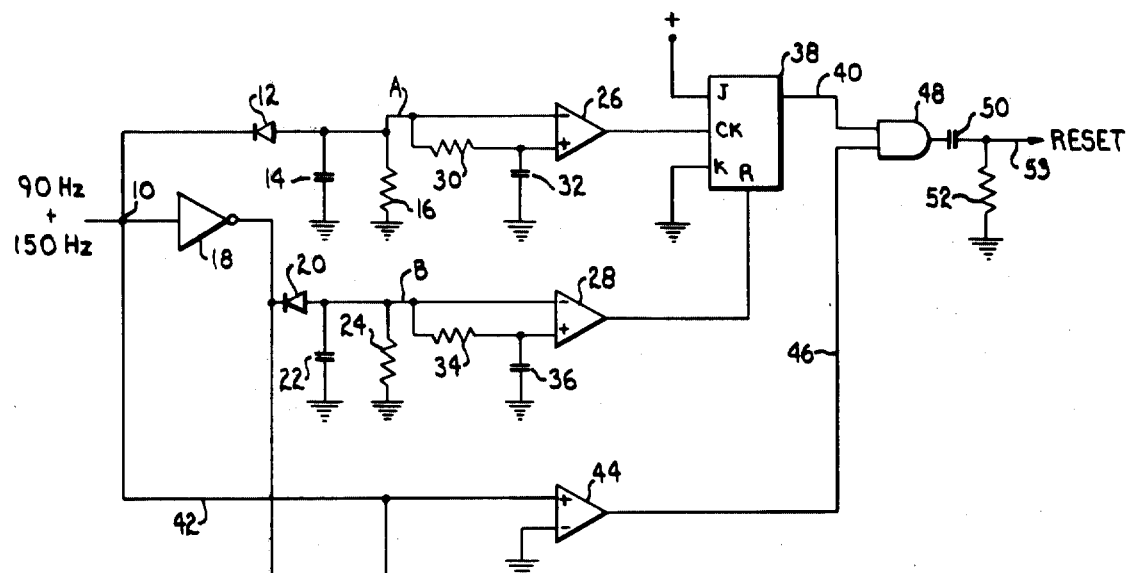
Figure 1:
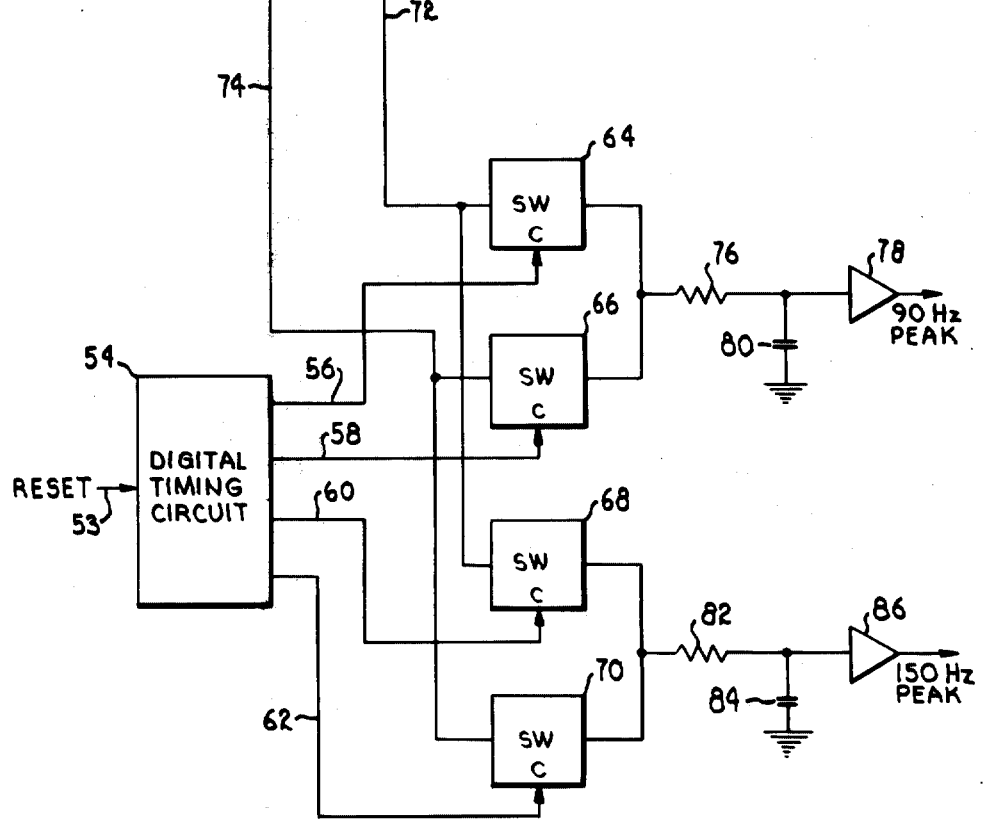

United States Patent [19]

Mears

[11] 4,024,459
[45] May 17, 1977

[54] AMPLITUDE MEASUREMENT OF SIGNALS OF DIFFERENT FREQUENCY

[75] Inventor: William E. Mears, Leawood, Kans.

[73] Assignee: Wilcox Electric, Inc., Kansas City, Mo.

[22] Filed: Jan. 15, 1976

[21] Appl. No.: 649,464

[52] U.S. Cl. .......................... 328/139; 235/150.22; 307/351; 307/358; 324/103 P; 328/151; 329/50; 340/27 AT

[51] Int. Cl.² ...................... H03K 5/20; H03K 9/06

[58] Field of Search .......... 328/117, 139, 150, 151; 307/235 A, 235 E, 235 J; 324/103 P; 329/50, 112, 123, 166; 340/27 AT; 235/150.22

[56] References Cited

UNITED STATES PATENTS

| | | | |
|---|---|---|---|
| 3,524,994 | 8/1970 | Ritter | 307/235 A |
| 3,789,306 | 1/1974 | Hammerschlag | 307/235 A |

Primary Examiner—John Zazworsky

Attorney, Agent, or Firm—D. A. N. Chase

[57] ABSTRACT

The peak amplitudes of alternating components of a composite alternating signal are determined without separating the components from one another, where such components are of different frequencies but have substantially in-phase zero crossings at recurring intervals. In an instrument landing system for aircraft, 90 Hz and 150 Hz signals form the components of a composite modulating signal and the zero crossing points of both components are accurately controlled. The composite 90 and 150 Hz signal is examined by a circuit which produces a reference pulse at the zero crossing time of both component frequencies in the positive direction. The reference pulses maintain digital timing circuitry in synchronism with the 90 Hz and 150 Hz components, and the composite wave form is sampled at each frequency to synchronously detect the peak amplitude of each component in separate detector circuits.

9 Claims, 2 Drawing Figures

AMPLITUDE MEASUREMENT OF SIGNALS OF DIFFERENT FREQUENCY

This invention relates to the demodulating of composite signals having components of different frequencies and, more particularly, to apparatus for determining the amplitudes of such components without separating the same from one another.

An instrument landing system (ILS) for aircraft provides guidance both in the azimuth plane for alignment with the runway and along the glide path of the approaching aircraft. Guidance in the azimuth plane is accomplished by the localizer portion of the system which defines a line of approach corresponding to the center line of the runway. Space-modulated radio navigation signals are received and demodulated by the airborne receiver and, if the aircraft is on the line of approach, the difference in the depth of modulation (ddm) of detected 90 Hz and 150 Hz signals is zero. Likewise, in the glide slope portion of the system, the ddm is also zero if the aircraft is in the defined glide path.

Accordingly, in an ILS it is required that the amplitudes of the 90 Hz and 150 Hz signals be accurately measured so that their ratios may be compared, since this ratio or ddm represents the position of the aircraft relative to the navigational course. Furthermore, the ground transmitting equipment of an ILS employs a monitor of system operation which also requires an accurate determination of the relative amplitudes of these two signals. It is the usual practice in such monitors to employ probes that sample the radio frequency signals radiated from the antenna array, together with a recombining and separation network that recreates the original input signals to the antenna system from the samples obtained by the probes. Such recreated signals are demodulated to retrieve the 90 Hz and 150 Hz signals, whose amplitudes must be accurately measured in order to determine whether or not the system is operating properly.

The conventional demodulation approach is to filter the composite 90 and 150 Hz signal to separate the 90 Hz component from the 150 Hz component, and then compare their amplitudes. However, this technique is subject to inaccuracy and drift problems due to the separate, high Q channels employed. A second inherent disadvantage, which is of special importance in the airborne equipment, is that the use of filter networks increases the bulk and weight of the airborne receiver as compared with more desirable integrated circuit techniques. In considering the problem of demodulation without filtering and separate detection, an important consideration is that the 90 Hz and 150 Hz signals in an ILS are locked in a fixed phase relationship in accordance with specifications for systems of this type. Each of these two signal components crosses zero (changes polarity) in the same direction at the same time every 1/60 of a second, with the direction of simultaneous polarity change alternating positive and negative. Thus, at recurring intervals of 1/30 second, each component crosses zero in one direction (positive or negative) and repeats. The time difference in the zero crossing points between the two components is held very accurately to less than 50 microseconds.

It is, therefore, the primary object of the present invention to provide apparatus for determining the amplitudes of alternating components of a composite alternating signal without separating such components from one another, wherein the components are of different frequencies but have substantially in-phase zero crossings at recurring intervals.

As a corollary to the foregoing object, it is an important aim of this invention to provide apparatus as aforesaid for utilization in an instrument landing system in order to provide for the accurate measurement of the amplitudes of the 90 Hz and 150 Hz signals, both for the determination of the position of the aircraft and for monitoring purposes in the ground transmitting equipment.

Another important object is to provide apparatus as aforesaid which is not subject to the problems inherent in prior art demodulation methods where active or passive filters are employed.

Still another important object of the invention is to provide apparatus as aforesaid which is compact, light in weight and has low power requirements, and wherein the signal balance is unaffected.

Figure 2:
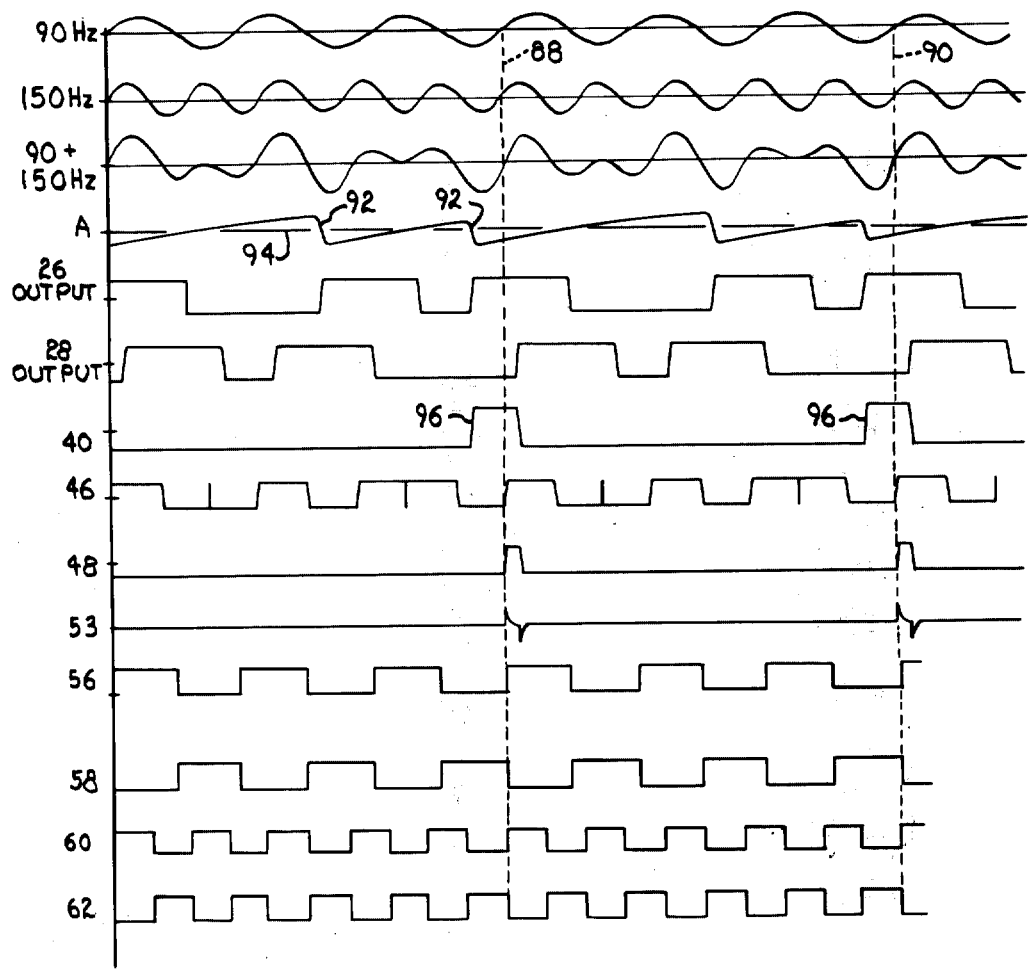

In the drawings:

FIG. 1 is an electrical schematic and logic diagram of the demodulator apparatus of the present invention; and FIG. 2 is a diagram showing various wave forms that illustrate the operation of the apparatus, corresponding times in the various wave forms being in vertical alignment.

Referring to FIG. 1, a composite, alternating signal is fed to input terminal 10 and is directed to two peak detectors in separate detection channels. The first detector comprises a diode 12 and a long time constant filter formed by capacitor 14 and resistor 16. An inverter 18 is connected between the input terminal 10 and the diode 20 of the second detector, which also includes a filter formed by a capacitor 22 and a resistor 24. The input signal applied to the terminal 10 of the illustrated embodiment is composed of 90 Hz and 150 Hz sinusoidal components; representative values for the capacitors 14 and 22 and the resistors 16 and 24 are 1 mfd and 47,000 ohms.

The outputs of the two detector channels are fed to a pair of voltage comparators 26 and 28, each having a positive input (+) and a negative or inverting input (−). In the first channel, the anode of the diode 12 is connected directly to the inverting input of the comparator 26 by a lead A, the capacitor 14 and the resistor 16 being connected in parallel between this connection A and system ground. Another long time constant filter comprises a series resistor 30 between the connection A and the positive input, and a capacitor 32 between the positive input and ground.

The input circuitry of comparator 28 is likewise arranged with the anode of diode 20 connected directly to the inverting input by a lead B. A long time constant filter is connected between this common connection B and the positive input, and comprises a series resistor 34 and a parallel capacitor 36. For use with a composite 90 and 150 Hz input signal, representative values of the resistors 30 and 34 and the capacitors 32 and 36 are 47,000 ohms and 1 mfd. It is to be noted that, although the diodes 12 and 20 in the two detection channels are poled in the same direction, the inverter 18 is interposed between the input terminal 10 and the cathode of diode 20 whereas the cathode of diode 12 is directly connected to terminal 10.

A JK flip-flop 38 has its J input connected to a positive direct voltage corresponding to a "high" logic level, and its K input tied to system ground (corresponding to a "low" logic level). The clock (CK) input of flip-flop 38 receives the output from comparator 26, and the reset (R) input of flip-flop 38 receives the output of comparator 28. Assuming that the reset input is at the low level, flip-flop 38 sets on the positive-going edge of a pulse applied to the clock input and remains set until the high level is applied to the reset input. In the set condition, the output lead 40 from flip-flop 38 is at the high level.

A lead 42 extends from the input terminal 10 to the positive (+) input of a voltage comparator 44 which functions as a zero crossing detector responsive to the composite input signal. The negative or inverting (−) input of comparator 44 is connected directly to system ground. A lead 46 from the output of comparator 44, and the output lead 40 from flip-flop 38 extend to the respective inputs of a two-input AND gate 48. The output of AND gate 48 is differentiated by the action of a series capacitor 50 and a parallel resistor 52 and serves a reset function as indicated by the legends.

The reset output from AND gate 48 appearing on lead 53 is applied to a digital timing circuit 54 of conventional design having two sets of outputs, one represented by a pair of leads 56 and 58 and the other represented by a pair of leads 60 and 62. In the illustrated embodiment, the timing circuit 54 produces two sets of square waves in 180° phase relationship, one at a frequency of 90 Hz (leads 56 and 58) and the other at a frequency of 150 Hz (leads 60 and 62). The timing circuit 54 may, for example, comprise a crystal oscillator driving divide circuits which reduce the oscillator frequency to the relatively low frequency values (90 and 150 Hz) desired. The differentiated output of AND gate 48 provides a reference signal to synchronize the 90 Hz square wave timing signals on leads 56–62 with the incoming composite signal as will be discussed hereinafter, this being accomplished typically in circuitry of this type by applying the reference signal to the reset inputs of the counter flip-flops (not shown) in the divide circuits.

A synchronous detector employs a pair of detector circuits responsive to the respective 90 Hz and 150 Hz timing signals and the incoming composite signal, and includes four CMOS switches 64, 66, 68 and 70 having control (C) inputs connected to leads 56, 58, 60 and 62 respectively. A lead 72 is an extension of lead 42 and delivers the input signal to one of the switching terminals of each of the switches 64 and 68. A lead 74 extends from the output of inverter 18 and delivers the inverted input signal to one of the switching terminals of switches 66 and 70. The other switching terminal of each of the switches 64 and 66 presents a common output that is connected by a series resistor 76 to the input of an amplifier 78. A capacitor 80 across the amplifier input and ground cooperates with resistor 76 to provide an integrator or low pass filter between the common output of switches 64 and 66 and the input of amplifier 78. Likewise, a series resistor 82 and a parallel capacitor 84 provide an integrator circuit between the common output of switches 68 and 70 and the input of an amplifier 86. Each of the amplifiers 78 and 86 has an amplification factor of 1/.636 in order to provide outputs equal to the peak amplitudes of the 90 Hz and 150 Hz components, as will be explained.

OPERATION

Referring to FIG. 2, the first and second wave forms are the 90 Hz and 150 Hz components respectively of the composite input signal represented by the third wave form. As mentioned previously, in instrument landing systems the 90 Hz and 150 Hz signals are locked in a fixed phase relationship and their zero crossings are closely controlled. Accordingly, it may be seen in FIG. 2 that the two components cross zero in the positive direction every 1/30 of a second which, in FIG. 2, appears at the common Y axis of the graphs and the broken vertical lines 88 and 90. In the particular logic utilized in the illustrated embodiment, the simultaneous negative-going zero crossings midway between the positive-going crossings are disregarded. Each of the remaining graphs bears a designation at the left corresponding to the particular point, lead or element in the circuitry at which the corresponding wave form appears.

The wave form appearing at lead A is the output of the peak detector which receives the composite input signal without inversion. Abrupt negative-going excursions 92 in the wave form occur at the negative peaks of the composite input signal. The effect of the filter 30, 32 is to smooth the wave form and produce an average value illustrated by the horizontal line 94 superimposed on the detector output wave form. The detector output wave form is, therefore, at times positive with respect to the average value 94 and at times negative with respect thereto. Accordingly, the detector output being applied to the inverting input of comparator 26 and the average value (wave form 94) being applied to the positive input, the output of comparator 26 is a pulse train that swings back and forth between positive and negative levels. More particularly, when the voltage at the inverting input (lead A) is below the average value voltage applied to the positive input, then the output of comparator 26 is positive; similarly, when the voltage at the inverting input is above the voltage at the positive input, the output of comparator 26 is negative since the more positive level is applied to its inverting (−) input.

The process of peak detection is likewise accomplished in the second detector channel except that this detector receives the composite 90 and 150 Hz input signal in inverted form. Accordingly, by detecting the negative peaks of the inverted signal, the second detector in effect detects the positive peaks of the noninverted input signal. Therefore, the detector output on lead B is a wave form identical to that illustrated for lead A in FIG. 2 except that it is displaced 180°. The result is a train of pulses from the output of comparator 28 illustrated in FIG. 2 wherein the wave form presented is identical to the output of comparator 26 but for the 180° phase displacement. It is evident that the positive-going edges of both pulse trains correspond in time to the positive and negative peaks of the composite input signal.

Since the J input of flip-flop 38 is tied high and the K input is tied low, the flip-flop output will be held low so long as the high logic level is maintained on its reset input R. Accordingly, the flip-flop 38 will be set on the leading edge of a clock pulse from comparator 26 only if the reset input is low. The flip-flop 38 is thus caused to deliver a series of pulses 96 appearing on output lead 40, each pulse 96 having a width corresponding to the interval defined by a corresponding pair of successive positive and negative peaks of the composite input signal. In the particular logic utilized, the zero crossing encompassed by each pulse 96 is the crossing that occurs when the composite signal changes polarity in the positive direction (goes from a negative peak to a positive peak).

The pulses 96 from the output of flip-flop 38 and the timing information from the zero crossing detector (comparator 44) are both fed to the AND gate 48 which, as is clear in FIG. 2, delivers an output when a zero crossing of the composite signal occurs during one of the pulses 96. This output is differentiated and the positive spikes present the reference signal used to reset the digital timing circuit 54. The 90 Hz timing signal appearing on leads 56 and 58 is composed of two square waves 180° out of phase with each other, and likewise for the 150 Hz timing signal appearing on leads 60 and 62. Each of the CMOS switches 64–70 is open when a negative level is applied to its control input and closed in response to a positive level. Accordingly, the switches 64 and 66 are operated alternately by the 90 Hz square waves on leads 56 and 58 and, since switch 64 receives the composite input signal and switch 66 receives such signal in inverted form, the capacitor 80 charges to a positive voltage representative of the peak amplitude of the 90 Hz component. The 150 Hz component will average to zero over the 1/30 of a second period. Likewise, in the other detector circuit employing switches 68 and 70, the capacitor 84 charges to a level representing the peak value of the 150 Hz component and the 90 Hz component averages to zero.

In order for the two detector circuits to deliver voltage levels equal to the peak levels of the 90 Hz and 150 Hz components, the amplifiers 78 and 86 are necessary since the average value of a full wave rectified sine wave is 0.636 times the peak value. It should be understood that the switch pair and RC network of each circuit operates as a full wave rectifier and filter at the synchronous frequency. Accordingly, each of the amplifiers 78 and 86 has an amplification factor of 1/0.636.

In an ILS, the output signals from the amplifiers 78 and 86 are fed to appropriate comparison circuitry (not shown) to determine the difference in the depth of modulation (ddm) and any other parameters desired. This is done in the airborne receiver to determine the position of the aircraft relative to the navigational course, and in the ground equipment in the monitor in order to check system operation.

It may be appreciated that the demodulation accomplished with the present invention does not employ active or passive filters to separate the 90 Hz and 150 Hz components, and that the component signals follow essentially the same path and therefore suffer the same gain or attenuation. Since the balance of the components is unaffected, no compensating adjustments or calibration is required. Furthermore, the demodulator may be made very small in physical size and light in weight, and requires low power since integrated circuit technology may be used throughout.

Having thus described the invention, what is claimed as new and desired to be covered by Letters Patent is:

1. Apparatus for determining the amplitude of one of the alternating components of a composite alternating signal, said components being of different frequencies and having substantially in-phase zero crossings at recurring intervals, said apparatus comprising:
    means responsive to said composite signal for detecting the times at which the positive and negative peaks thereof occur;
    means connected with said peak detecting means, responsive to the times at which said peaks occur and to the polarity changes of said composite signal for producing a reference signal each time said composite signal changes polarity in one direction between successive positive and negative peaks, whereby each reference signal is produced at a time related to the zero crossing of said components in said one direction;
    timing circuitry responsive to said reference signals for producing a timing signal having the same frequency as said one component and occurring in synchronism therewith; and
    synchronous detector means connected with said timing circuitry and responsive to said timing signal and said composite signal for delivering an output signal having a magnitude representing the amplitude of said one component.

2. The apparatus as claimed in claim 1, further comprising a zero crossing detector responsive to said composite signal for determining the times at which the polarity thereof changes, said reference signal producing means being connected with said zero crossing detector and responsive to both the times at which said polarity changes and the times at which said peaks occur.

3. The apparatus as claimed in claim 2, wherein said reference signal producing means includes circuit means for producing a series of pulses, each having a width corresponding to the interval defined by a respective pair of successive positive and negative peaks of said composite signal, and output means receiving the polarity change pulses and said timing information from the zero crossing detector for delivering each of said reference signals when a polarity change in said composite signal occurs during a received pulse.

4. The apparatus as claimed in claim 1, wherein said peak detecting means includes a first peak detector for determining the times at which said positive peaks occur and a second peak detector for determining the times at which said negative peaks occur, said first and second peak detectors generating first and second pulse trains bearing the timing information obtained, and wherein said reference signal producing means includes circuit means responsive to said pulse trains for producing a series of pulses, each having a width corresponding to the interval defined by a respective pair of successive positive and negative peaks of said composite signal, and output means receiving said series of pulses and responsive to the polarity changes of said composite signal for delivering each of said reference signals when a polarity change occurs during a received pulse.

5. In an instrument landing system in which a pair of alternating signals of different frequencies form the components of a composite alternating signal that appears as modulation on a transmitted radio frequency signal, said components having substantially in-phase zero crossings at recurring intervals, demodulator apparatus for determining the amplitude of each of said components comprising:
    means responsive to said composite signal for detecting the times at which the positive and negative peaks thereof occur;
    means connected with said peak detecting means, responsive to the times at which said peaks occur and to the polarity changes of said composite signal for producing a reference signal each time said composite signal changes polarity in one direction between successive positive and negative peaks, whereby each reference signal is produced at a time related to the zero crossings of both of said components in said one direction;

timing circuitry responsive to said reference signals for producing a pair of timing signals having the same respective frequencies as said components and occurring in synchronism therewith; and synchronous detector means connected with said timing circuitry and responsive to said timing signals and said composite signal for delivering a pair of output signals, each of which has a magnitude representing the amplitude of a corresponding component.

6. The apparatus as claimed in claim 5, further comprising a zero crossing detector responsive to said composite signal for determining the times at which the polarity thereof changes, said reference signal producing means being connected with said zero crossing detector and responsive to both the times at which said polarity changes and the times at which said peaks occur.

7. The apparatus as claimed in claim 6, wherein said reference signal producing means includes circuit means for producing a series of pulses, each having a width corresponding to the interval defined by a respective pair of successive positive and negative peaks of said composite signal, and output means receiving said pulses and the polarity change timing information from the zero crossing detector for delivering each of said reference signals when a polarity change in said composite signal occurs during a received pulse.

8. The apparatus as claimed in claim 5, wherein said peak detecting means includes a first peak detector for determining the times at which said positive peaks occur and a second peak detector for determining the times at which said negative peaks occur, said first and second peak detectors generating first and second pulse trains bearing the timing information obtained, and wherein said reference signal producing means includes circuit means responsive to said pulse trains for producing a series of pulses, each having a width corresponding to the interval defined by a respective pair of successive positive and negative peaks of said composite signal, and output means receiving said series of pulses and responsive to the polarity changes of said composite signal for delivering each of said reference signals when a polarity change occurs during a received pulse.

9. Apparatus as claimed in claim 5, wherein means is provided for shifting the phase of said composite signal 180°, and wherein said synchronous detector means has a pair of detector circuits for producing said pair of output signals, each detector circuit including a pair of switching devices receiving said composite signal and the phase-shifted composite signal respectively and being operated by the corresponding timing signal to produce a full-wave rectified output, and means responsive to the rectified output for providing the output signal from the detector circuit with a DC amplitude equal to the peak amplitude of the corresponding component.

* * * * *